(12) United States Patent
Temerinac

(10) Patent No.: US 6,938,063 B2
(45) Date of Patent: *Aug. 30, 2005

(54) PROGRAMMABLE FILTER ARCHITECTURE

(75) Inventor: Miodrag Temerinac, Gundelfingen (DE)

(73) Assignee: Micronas GmbH, Freiburg (DE)

(*) Notice: Subject to any disclaimer, the term of this patent is extended or adjusted under 35 U.S.C. 154(b) by 438 days.

This patent is subject to a terminal disclaimer.

(21) Appl. No.: 09/919,579

(22) Filed: Jul. 30, 2001

(65) Prior Publication Data

US 2002/0049797 A1 Apr. 25, 2002

(51) Int. Cl.[7] .............................................. G06F 17/10
(52) U.S. Cl. ....................................... 708/319; 708/320
(58) Field of Search ................................ 708/300, 301, 708/313, 316, 319, 320

(56) References Cited

U.S. PATENT DOCUMENTS

| | | | |
|---|---|---|---|
| 5,262,974 A | | 11/1993 | Hausman et al. |
| 5,339,264 A | * | 8/1994 | Said et al. ............. 708/319 |
| 5,479,363 A | | 12/1995 | Willson, Jr. et al. |
| 5,487,023 A | | 1/1996 | Seckora |
| 5,790,439 A | * | 8/1998 | Yamanaka et al. ...... 708/316 |
| 5,892,695 A | * | 4/1999 | Van Dalfsen et al. ... 708/313 |

\* cited by examiner

*Primary Examiner*—Chuong Dinh Ngo
(74) *Attorney, Agent, or Firm*—O'Shea Getz & Kosakowski P.C.

(57) ABSTRACT

A filter (50) with interconnected modular basic units (10) and with a delay line (51), equipped with takeoff points, to furnish delayed sampling values (x1, ..., xN; xi) of a digital signal (x). Each basic unit (10) contains a programmable weighting device (11, 12), a linkage device (13, 14), and a delay device (15), which delays the data conducted to it by a single period (T) of the sampling clock pulse or by a simple integer multiple thereof. The filter (50) further contains a programmable control device (52), which switches over or switches off a part of the data inputs (16, 17) of the basic unit (10) to achieve forward and/or backward filtering and/or sign inversion and/or a change of the active filter length.

13 Claims, 3 Drawing Sheets

Fig. 1
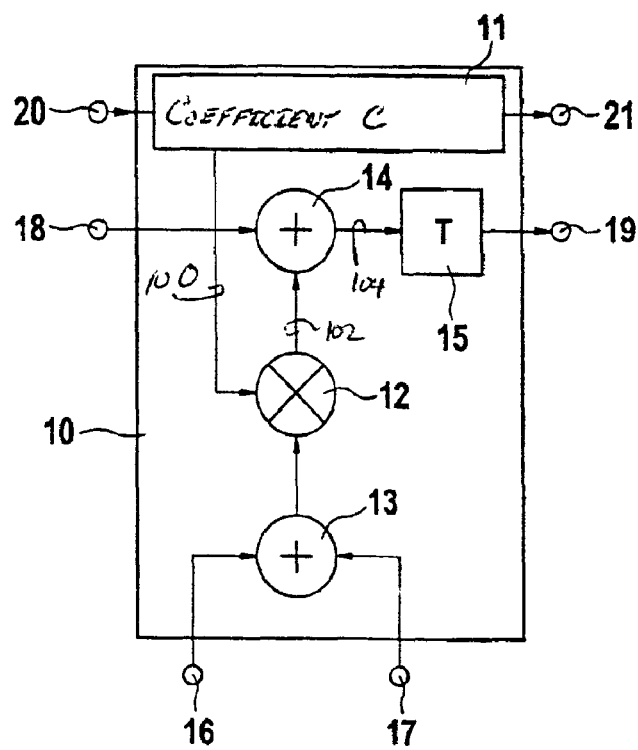
Fig. 2
Fig. 3
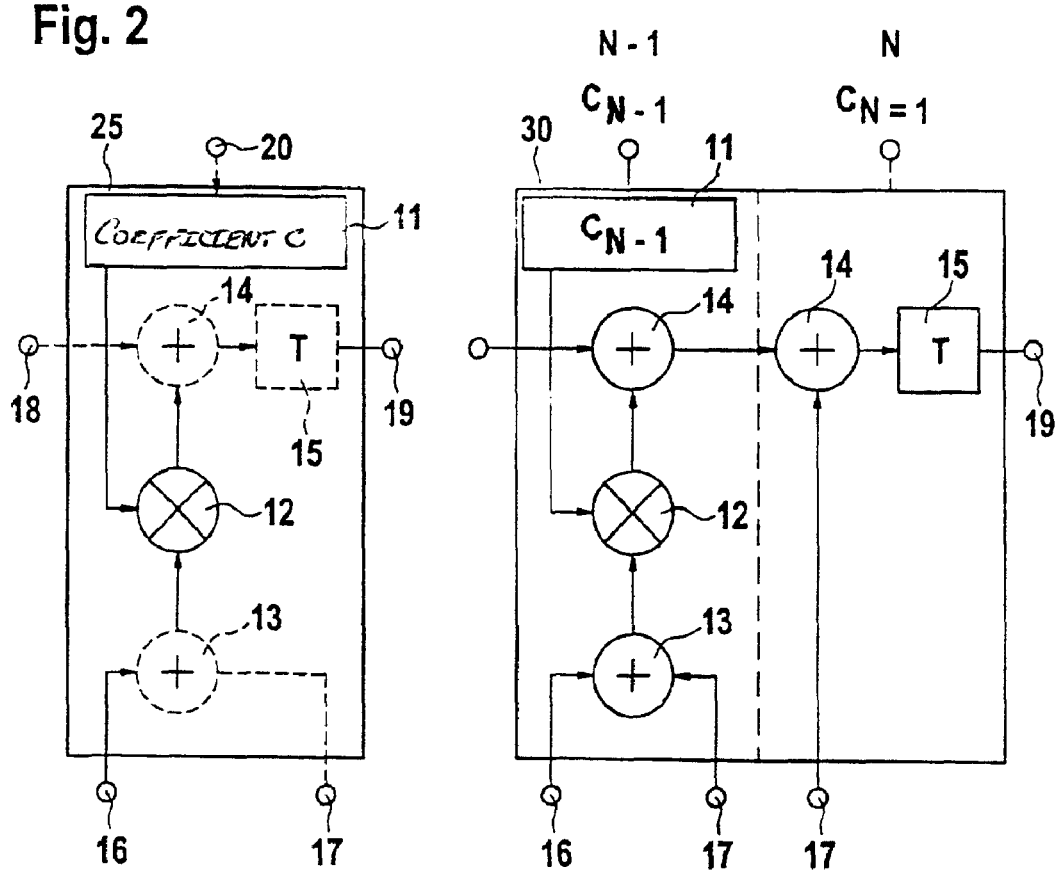

PROGRAMMABLE FILTER ARCHITECTURE

BACKGROUND OF THE INVENTION

The invention relates to a monolithically integrated filter to process digitized signals, and in particular to a digital filter configurable with a plurality of basic units.

Monolithically integrated filters are used in digital signal processing for various tasks including signal extraction and signal formation. As known their advantages compared to analog filters include exact specification of their properties and lack of sensitivity to manufacturing tolerances, aging, temperature, interference, and other influences. As the number of functional units within a single monolithically integrated circuit increases, the number of digital filters used therein typically increases.

If the digital signals being processed have a low clock rate, a digital signal processor (DSP) can be programmed to yield the desired digital filter function. Such filter realizations are especially advantageous where the filter properties must be matched to specific signal standards (e.g., with a multi-standard receiver for television or audio signals). Configuring the DSP to match the different standards is relatively easy since the configuration is set by the executable code associated with the DSP. Without such programming, a special static filter set would always be required for different standards. The different programs also make it possible to switch back and forth between different filter functions (e.g., between a low-pass and a high-pass function).

However, digital signal processors cannot be used when the data rates being processed are too high for the particular signal processor. For example, with a frequency above 5 MHz, the speed of the current processors is too slow, and therefore parallel hardware architectures must be used for filter realization. However, such hardware architectures consume much space in monolithically integrated circuits. The desired flexibility consequently must be purchased expensively by furnishing parallel structures, of which only a single one is always in operation.

Therefore, there is a need for a flexible (i.e., programmable) filter that can process digital signals with a high data rate and can be monolithically integrated.

SUMMARY OF THE INVENTION

Briefly, according to an aspect of the present invention, the filter has a programmable filter architecture, which includes interconnected modular basic units, a delay line and a programmable control device. The delay line forms the required sampling values from an input digital signal, and these are conducted to the interconnected basic units. The individual sampling values represent the digital signal, the particular sampling times corresponding to an associated sampling and digitizing clock pulse. The delay times of the sampled values are separated by integer multiples, and in particular by even multiples of the period of the sampling clock pulse. To calculate the filter values, each basic unit contains a programmable weighting device, a logical linkage device, and a delay device, which delays intermediate values by a single period of the sampling clock pulse or an integer multiple thereof. The filter also includes a programmable control device that influences the basic filter function by switching a part of the data inputs of the basic units on or off. In this way, forward or backward filtering can be implemented for these inputs, and/or the respective sign can be inverted for these inputs, and/or the active filter length can be changed. The latter is especially useful for making the number of sampling values even or odd, depending on the particular requirements. The programmable weighting device includes a multiplier and a programmable coefficient register, which can be replaced by a coefficient bus. The programmable control device contains switching devices, which couple approximately half the data inputs of the basic units either to the output of the delay line or to the output of the modular interconnected basic units. The signal path to the above-mentioned data inputs also includes a sign inverter, which inverts the sign of the data passing through it, depending on a programmable control signal.

If, in a particular application, not all the programming capabilities are required, then appropriate simplifications are easily possible. For example, it may also prove appropriate to modify one or two stages at the beginning or end of the interconnected modular basic units.

The programmable architecture is suited to implement linear phased finite impulse response (FIR) filters with an "even-symmetric" or "odd-symmetric" pulse response and infinite impulse response (IIR) all-pass filters with an odd filter length for low-pass, high-pass, or group running time filters. Linear phase filters have important applications in digital signal processing, for example as a Hilbert filter pair for separating quadrature-modulated signals.

These and other objects, features and advantages of the present invention will become more apparent in light of the following detailed description of preferred embodiments thereof, as illustrated in the accompanying drawings.

BRIEF DESCRIPTION OF THE DRAWING

FIG. 1 is a block diagram illustration of a basic unit;

FIG. 2 is a block diagram illustration of a modified basic unit;

FIG. 3 is a block diagram illustration of a modified module in an IIR filter;

DETAILED DESCRIPTION OF THE INVENTION

Figure 4:
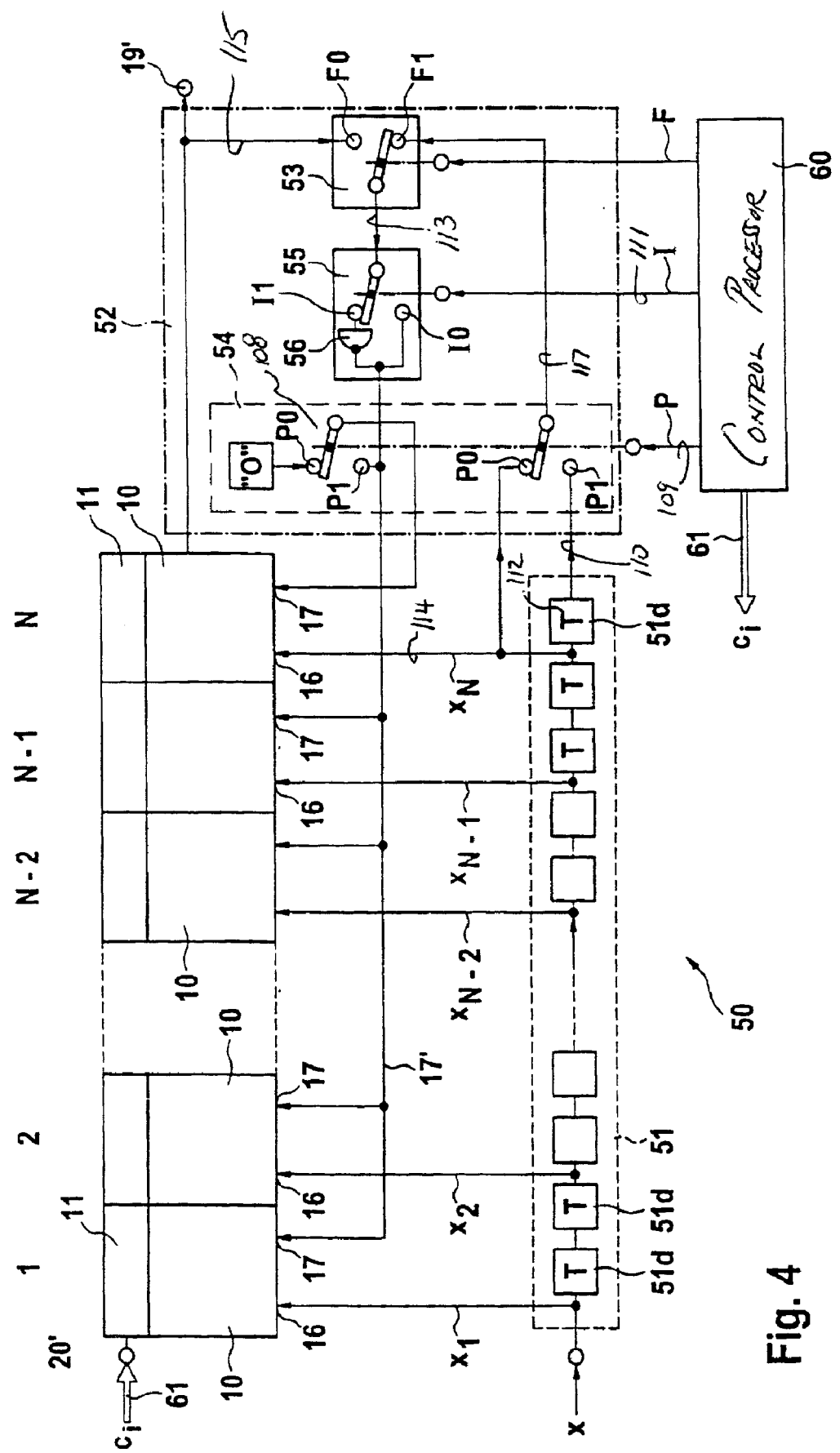
FIG. 4 is a block diagram illustration of a programmable filter that includes a plurality of basic units.

FIG. 1 is a block diagram illustration of a basic unit 10, which is used as a modular unit within a programmable filter architecture. The basic unit 10 includes various functional units that calculate modular filter values. Specifically, the basic unit 10 includes a programmable weighting device having a register 11, a multiplier 12, first and second adders 13, 14, and a delay device 15. The delay line 15 delays its input signal by a period T of the sampling clock pulse. The weighting is controlled by programming a coefficient value c, which is stored in the register 11. The register outputs the coefficient c on a line 100 to the multiplier 12. Each basic unit 10 has three data inputs 16, 17, 18. The first and second data inputs 16, 17 are used for the input of data to be weighted with the same coefficient c. These inputs are added in the first adder 13 and the resultant sum is input to the multiplier 12, which provides a weighted signal value on a line 102.

The output data value of the neighboring module (FIG. 2) is input to the basic unit 10 on a third data input 18 and summed with the weighted signal on the line 102, and the sum on line 104 is input to the delay device 15. The signal on the line 104 is delayed by one period T of the sampling clock pulse, and the delayed signal is output on the line 19. Neighboring basic units 10 are connected to one another in the signal flow direction through their data outputs 19 and data inputs 18.

So that the coefficient c in the register 11 can be replaced, the register contains a coefficient input 20. The register also includes a coefficient output 21 so interconnected basic units 10 can be connected such that the coefficient registers form a shift register. Via this shift register all the coefficients $c_i$ can then be replaced easily by a control processor 60 (FIG. 4), hence the programmable feature of the filter. If the coefficient values $c_i$ are fixed (i.e., constant) then the respective coefficient input is not necessary and the coefficient c is permanently stored in the register 11.

FIG. 2 is a block diagram illustration of a modified basic unit 25, in which the dashed functional units are optional and may be absent in some circumstances. For example, the third data input on the line 18 and the associated second adder 14 are not required in the first stage of the modular interconnected basic units. Therefore, the output value of the multiplier 12 can be conducted directly to the input of the delay device 15. With an unchanged basic unit 10 the value zero would be conducted in this case to the third data input 18, and thus to the adder 14.

In the last stage N of modular interconnected basic units 10, the second data input on the line 17 and the associated first adder 13 are not required, if the number of required sampling values is always odd.

In some cases, with feedback filters, the delay device 15 is also absent in the last or next to last stage of a programmable filter constructed of a plurality of basic units 10. An example of the two last stages of such a feedback filter is illustrated in FIG. 3.

FIG. 3 is a block diagram illustration of a module 30 that corresponds to the last two stages N-1 and N of the N number of modular interconnected basic units 10 configured for example as an IIR filter. The stage N-1 includes weighting factor $C_{N-1}$. The weighting factor in the last stage N is equal to one, which corresponds to an unchanged pass-through of the data value. Furthermore, compared to the complete basic units 10, the module 30 lacks one of the two delay stages 15 and the second data input on the line 17 of the last stage N.

FIG. 4 is a block diagram illustration of a programmable filter 50, which contains N modular interconnected basic units 10. The first data inputs 16 are connected to the takeoff points of a delay line 51, which makes available N delayed sample values $x_1$ to $x_N$ at its takeoff points. A digital input signal x is conducted to the input of the delay line 51. The input signal x is to be processed by the filter 50, which provides a filtered output signal xf on a line 19'. The delay line 51 includes a series arrangement of delay stages 51$d$, each of which delay the digital signal by a period T of the associated digitizing clock pulse. In the embodiment of FIG. 4, a sampling value is not tapped after every delay stage, but rather after two delay stages 51$d$. All the sample values $x_1$ to $x_N$ are equidistant relative to the digital input signal x and are available in parallel for processing in the basic units 10.

The operations performed in the basic units 10 include additions, multiplications of intermediate values with a fixed coefficient $c_i$, and a delay by integer periods T of the digitizing clock pulse, especially by a single period. The programmable filter 50 also includes a programmable control device 52 that receives command signals from a control processor in order to configure, that is program the filter. The programmable control device 52 includes a first switching device 53, which is coupled to the second data input 17 of the modular interconnected basic units 10, and which can optionally control the associated data sources. The programmable control device 52 also includes a second switching device 54, by means of which the number of delayed sampling values $x_1$ through $x_N$ can be changed, so as optionally to have available an even or odd number of sampling values. The programmable control device 52 contains a switchable sign inverter 55, to selectively invert the data values conducted to the second data inputs 17. In the embodiment of the filter 50 shown in FIG. 4, the programmable control device 52 contains electronic switch-over devices in the individual switching devices 53, 54, 55. These are controlled by the control signals F, P, I from a control processor 60. The electronic switch-over devices are primarily used to illustrate the switching function. With monolithic integration, naturally they are replaced by electronic switching means or are implemented in another way within the respective functional unit.

In the representation of FIG. 4, the first switching device 53 contains an electronic switch-over device, which can assume a first and second switch position F1 and F0 respectively. In the first switch position F1, the output of the electronic switch-over device is coupled to the output of the delay line 51, and in the second switch position F0 it is coupled to the filtered output signal on the line 19. Therefore, the first switch device 53 provides the filtered output signal xf or a data value derived therefrom to the second data input 17. The first switching device 53 is controlled by a first control signal F from the control processor 60, which is either a co-integrated or an external control device.

The second switching device 54 includes two coupled electronic switch-over devices each with a first and second switch position P1 and P0. The second switch-over device 54 is coupled to the last stage N of the delay line 51. In the first switch position P1, the signal on line 110 is input to the first switch device 53. In the second switch position P0, the signal $x_N$ on line 114 is provided to the first switch device 53. This switch-over device makes it possible to implement filters with an even or odd number of sampling values. This depends on the number of effective delay stages 51$d$; either this number is even or it is odd. The second switch-over device 108 of the switching device 54 is coupled to the last stage N of the modular interconnected basic units 10. In the first switch position P1, the output of this switching device 108 connects the second data input 17 to the data line 17' for the other two data inputs 17. When the second switch-over device 108 is in position P0, the second data input 17 of the last stage N of the modular interconnected basic units 10 is switched ineffective (i.e., either blocked or fed with the neutral data value zero). The second switching device 54 is controlled by a second control signal P on a line 109 from the control processor 60.

To clarify the mode of functioning, the switchable sign inverter 55 in FIG. 4 is likewise represented by an electronic switch-over device, whose two switch positions I1, I0 depend on a third control signal I on a line 111 from the control processor 60. In switch position I0, the input data value on the line 113 is switched through the switchable sign inverter 55 relatively unchanged (i.e., at most delayed by running time equalization). In switch position I1, the input data value on the line 113 is conducted through an inverting device 56 that inverts the sign of the signal. For digital signal processing and thus also for filter computer processes, the twos complement number system between the values −1 and +1 is generally used; consequently the inverting device 56 is appropriately adapted. If inversion entails an additional delay time for the inverted data, this must be taken into account by running time equalization at the relevant points in the filter architecture.

The input of the sign inverter 55 is connected to the output of the first switching device 53. The output of the sign inverter 55 feeds the common data line 17' for the second data inputs 17 of the modular interconnected basic units 10. Depending on the third control signal I on the line 111, all the second data inputs 17 are fed with an inverted or non-inverted data value indicative of the signal on the line 113. The value of the signal on the line 113 depends upon the switch position of the first switch device 53, and is selected from the signal on line 115 from the basic unit, or the signal on line 117 from the delay line 51.

Filter coefficients $c_i$ are provided by the control processor 60 or are retrieved from a memory device coupled to it. The coefficients $c_i$ are loaded via a coefficient bus 61 into the registers 11 of the modular interconnected basic units 10 that are cooperatively configured to provide the desired filter. The filter coefficients can be loaded via a parallel bus, which actuates each register 11 through a separate coefficient input 20. For example, if the filter 50 contains twenty modular interconnected basic units 10, a parallel coefficient bus 61 requires a rather large amount of space on the semiconductor. Consequently, a serial coefficient bus as shown in FIG. 4 is more suitable. In this embodiment, all the registers 11 are connected in series, and the coefficients $c_i$ are read serially into the individual registers 11 via the serial coefficient input lines 20'.

FIGS. 5–8 show typical impulse responses h(t) of FIR filters, which can be implemented with the programmable filter 50. Whether the filter length here is even, as in FIGS. 5 and 7, or odd as in FIGS. 6 and 8, depends on the switch position of the second switching device 54 (FIG. 4). With respect to FIGS. 5–8, the sampling values xi required to calculate the output signal xf are spaced equidistant at an interval of the clock pulse period T. They are situated symmetrically to the right and left of the reference time t0. With an even number of sampling values $x_i$, as in FIGS. 5 and 7, there is no central sampling value at the reference point t0, but only at the neighboring time points +/−T/2. The other sampling values then follow to the right and left at a spacing of +/−T. With an odd number of sampling values xi, as in FIGS. 6 and 8, the central sampling value is situated precisely at the reference time t0, and the next sampling values then follow to the left and right at intervals of +/−T.

Figure 5:
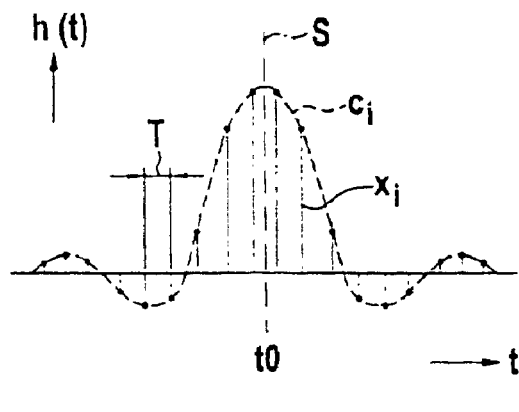
FIGS. 5–8 are plots of various impulse responses.
Figure 7:
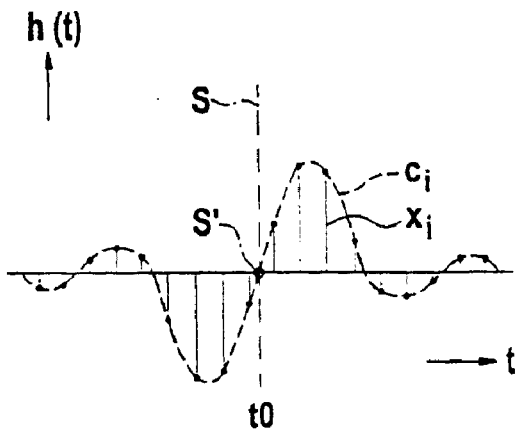
Figure 6:
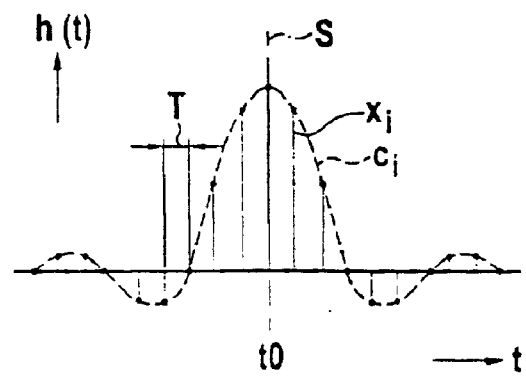
Figure 8:
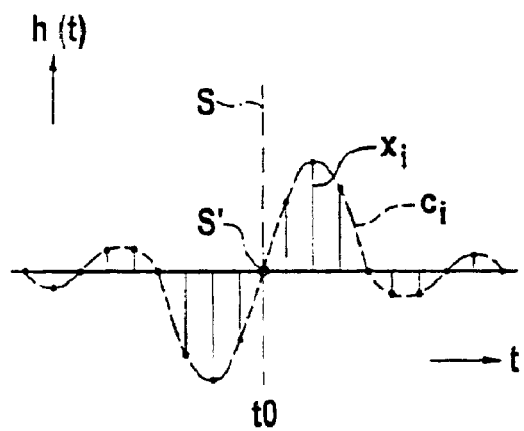

Preferred impulse responses h(t) here are symmetrical. In FIGS. 5 and 6, the impulse pattern is "even-symmetric" and in FIGS. 7 and 8 it is "odd-symmetric." The designation "even-symmetric" here mathematically corresponds to axis symmetry, which is defined in FIGS. 5 and 6 by a symmetry axis S running through the reference time point t0. The designation "odd-symmetric" mathematically corresponds to point symmetry, which is defined in FIGS. 7 and 8 by a symmetry point S', which lies on the time axis t at the reference time t0, and through which the impulse response h(t) also passes. In the programmable filter 50, the odd symmetry corresponding to FIGS. 7 and 8 is achieved by the sign inverter 55, which effectively inverts the filter output values to the left of the reference point 10 of an even symmetric pulse response mirrored at the symmetry axis S.

The specific pattern of the impulse response is programmed by suitable choice of the coefficients $c_i$. In FIGS. 5–8, the symmetry of the magnitude of the pulse response h(t) to the right and left of the reference point t0 is implemented by the special feed of the first and second data inputs 16, 17 and by association to the respective coefficient c, which is identical for the first and second data input 16, 17 of each basic unit 10. The contribution of each sampling value $x_i$ to the impulse response h(t) in FIGS. 5–8 is shown by the associated positive or negative value of the at dashed curve $c_i$. This value $c_i$ thus corresponds directly to the coefficient $c_i$ valid for this sampling value $x_i$.

The following compilation shows some advantageous applications of the programmable filter 50 in digital signal processing, especially in monolithically integrated circuits for processing signals in entertainment technology. The magnitude of the specific coefficients $c_i$ and the filter length will not be discussed here in more detail, since this depends on the particular filtering requirements and signal shape and, on the other hand, is also determined by usual methods, calculation or simulation, even with fixed filters. It is consequently sufficient to specify only the switch positions on the programmable control device 52 for the exemplary applications.

An important group of applications relates to the implementation of IIR all-passes for low- or high-pass filters or group running time undistorters, which are also called equalizers. Since these are feedback circuits, the first switch device 53 is commanded to switch position F0. The filter length is always odd, so that the switch position is programmed for the second switch device. The sign inverter 55 is placed into switch position I1 by the switch command signal on the line 111, in which the signs of the fed back data values are inverted. At the sampling frequency 1/T, the next to last basic unit N−1 in the weighting device 11, 12 and in the signal path to the data output 19 must have no delay. The delay device 15 thus must be omitted. The affected multiplier 12 consequently also must have no delay. It must be as fast as possible and must execute all the required steps for multiplication, such as forming the partial products and their addition, without time delay in parallel operation. The weighting in the last basic unit has the value $C_{N-1}$ and requires no multiplier 12. Instead of being conducted through a fast multiplier, the data value can simply be passed through; in this way there is no delay problem. The two last basic units N and N−1 consequently are suitably connected together as a special module, corresponding to FIG. 3, which, in the IIR application, replaces the two last basic units 10.

The other important group is the implementation of linear phase FIR filters. For example, when receiving digitally transmitted data, FIR filters are used on the transmission and receiving side as Nyquist (i.e., anti-abaising) filters to avoid inter-symbol interferences. Such filters have no signal feedback and have an "even-symmetric" impulse response h(t), an even filter length, and no inversion of data. The programmable control device 52 thus must specify the switch positions F1, P1, and I0 to configure the programmable filter as a FIR filter. In the event the FIR filter has an odd length, the second switch device 54 is commanded to position P0.

Hilbert filters also are FIR filters, and they can also occur as a Hilbert filter pair. Their filter length is generally even, so that the second switch position 54 generally is brought into switch position P1. The pattern of the impulse response h(t) can be even-symmetric or odd-symmetric. With an even-symmetric pattern, the setting of the switch positions corresponds to that of the above-mentioned Nyquist filter, with F1, P1, and I0. The first switching device 53 naturally is in switch position F1.

If the impulse response h(t) has an odd-symmetric pattern, the filter length is generally even, so that the second switching device 54 generally must be brought into switch position P1. The odd symmetric pattern requires inversion of the data conducted through the sign inverter 55, and thus the associated switch position is I1. Here, too, the first switching device 53 is in switch position F1.

When processing quadrature-modulated signals, Hilbert filter pairs are sometimes also used, whose impulse responses h(t) are related to one another such that one Hilbert filter has an even-symmetric impulse response h(t) while the other one has an odd-symmetric impulse response h(t).

Figure 9:
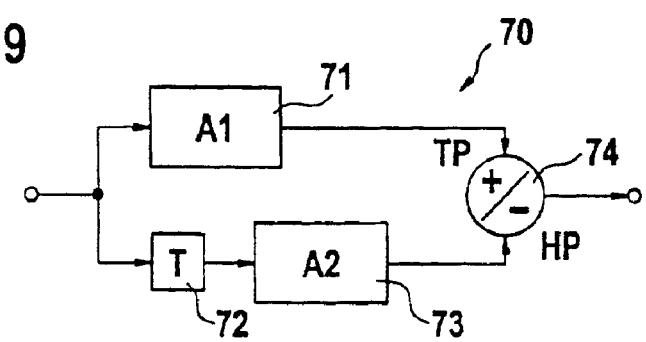
FIG. 9 is a block diagram illustration of a first application of the programmable filter configured in an all-pass arrangement.

FIG. 9 illustrates an IIR all-pass application 70, which requires two different all-passes 71, 73, one delay stage 72, and an adder/subtractor 74. Each of the two all-passes 71, 73 can be implemented with the programmable filter 50 of FIG. 4. If the data of the two signal branches are added in the adder/subtractor 74, the circuit 70 functions as a low-pass filter. When the two signal branches are subtracted, the circuit 70 has the function of a high-pass filter. The cut-off frequency is determined by specifying the coefficients $c_i$.

Figure 10:
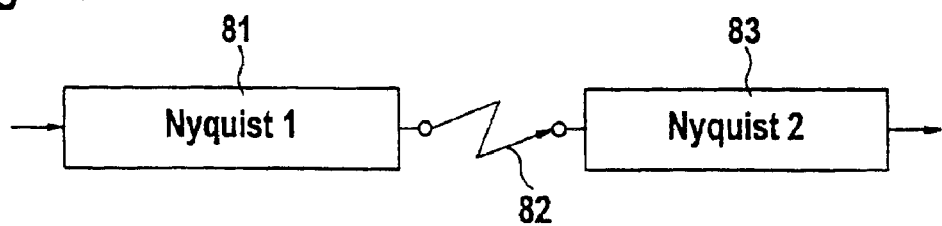
FIG. 10 is a block diagram illustration of a second application of the invention in a Nyquist filter pair.

Finally, FIG. 10 schematically shows an exemplary application for two FIR filters 81, 83 which are used as Nyquist filters 1 and 2 on the transmitter side and receiver side, respectively. These filters 81, 83 are intended to prevent inter-symbol interferences when receiving neighboring data, with the required bandwidth being as small as possible. Even with noisy transmission paths 82, this assures reliable reception of data. Such Nyquist filters are relatively expensive. The greater the number of different data sources and corresponding transmission standards that are available and are to be detected, the more advantageous proves to be the programmability of the associated Nyquist filters as a means to adapt to individual transmission standards.

Although the present invention has been shown and described with respect to several preferred embodiments thereof, various changes, omissions and additions to the form and detail thereof, may be made therein, without departing from the spirit and scope of the invention.

What is claimed is:

1. A filter comprising a plurality of interconnected modular basic units, and a delay line equipped with takeoff points to furnish delayed sampling values (x1, ..., xN; xi) of a digital signal (x), such that the delay times of the sampling values are integer multiples n of the period with n=0, 1, 2, 3, ... of a sampling clock pulse coupled to the digital signal (x), each basic unit contains a programmable weighting device, a linkage device, and a delay device, which delays the data conducted to it by a single period (T) of the sampling clock pulse or by a simple integer multiple thereof, and the filter further contains a programmable control device, which switches over or switches off a part, especially half, of the data inputs of the basic unit to achieve forward and/or backward filtering and/or sign inversion and/or a change of the active filter length, wherein the programmable control device comprises a sign inverter, which, in dependence on a third control signal (I), inverts the signs of the data values passed through it, which are conducted to the associated data inputs of the interconnected modular basic units, and said programmable control device further comprises a second switching device, which, in dependence on a second control signal (P), switches into an ineffective state a last stage (N) of the delay line and/or a data input.

2. The filter of claim 1, characterized in that the programmable weighting device comprises a multiplier, to whose first input a coefficient (c) is conducted and to whose second input a data value to be weighted is conducted, the coefficient (c) being programmable and being stored in a register.

3. The filter of claim 2, characterized in that the linkage device comprises a first adder, whose first and second input is coupled to a first and second data input of the basic unit, and whose output is coupled to the second input of the multiplier.

4. The filter of claim 3, characterized in that the respective first data input of the modular interconnected basic units are supplied with the delayed sampling values (x1, ..., xN) in sequential time order, and the respective second data inputs are supplied essentially uniformly with a single data value, which is coupled to the delay line, when the first switching device is in a first switch position (F1), and is coupled to at least one data output of the modular interconnected basic units, when said first switching device is in a second switching position (F0).

5. The filter of claim 4, characterized in that the linkage device comprises a second adder, whose first and second input are coupled to a third data input of the basic unit and to the output of the multiplier, and whose output is coupled to the input of the delay device, the third data input being used to accept an output data value of the preceding basic unit, and the output of the delay line being connected to a data output of the basic unit.

6. The filter of claim 5, characterized in that the registers of the modular interconnected basic units are linked to one another like a shift register through a coefficient input and a coefficient output, so as to write the coefficients (c) serially into the registers.

7. The filter of claim 6, characterized in that the number of existing functional units in the basic units, especially at the beginning and/or end of the modular interconnected basic units, is reduced, whereby modified basic units result.

8. A programmable digital filter that receives an input signal x[N] and provides a programmable digital filter output signal, said programmable digital filter comprising:

a first basic unit that receives and sums said input signal x[N] with said programmable digital filter output signal, and multiplies the resultant sum with a first coefficient signal value $C_N$ that is stored in a first memory element and provides a product that is input into a first delay of one period, wherein said first delay provides a first basic unit output signal;

a second basic unit that receives and sums a past value input signal x[N−2] with said programmable digital filter output signal and multiplies the resultant sum with a second coefficient value $C_{N-1}$ that is stored in a second memory element to provide a product that is summed with said first basic unit output signal and this resultant sum is input to a second delay of one period, wherein said second delay provides a second basic unit output signal;

a third basic unit that receives and multiplies a past value input signal x[N−4] with a third coefficient value $C_{N-2}$ that is stored in a third memory element to provide a product that is summed with said second basic unit output signal and the resultant sum is output as said programmable digital filter output signal;

a control processor that adaptively provides said first, second and third coefficient values; and a sign inverter, responsive to a first control signal from said control processor, for selectively inverting the sign of said programmable digital filter output signal that is fed back to said first basic unit and said second basic unit.

9. The programmable digital filter of claim 8, wherein said first and second memory elements are located in a common memory device.

10. The programmable digital filter of claim 8, wherein said programmable digital filter is located on a integrated circuit.

11. A programmable digital filter that receives an input signal x[N] and provides a programmable digital filter output signal, said programmable digital filter comprising:

a delay line having a plurality of delays, wherein said delay line receives said input signal x[N] and provides a past value input signal x[N−2] and a past value input signal x[N−4];

a first basic unit that receives and sums said input signal x[N] with said past value input signal x[N−4], and multiplies the resultant sum with a first coefficient signal value $C_N$ that is stored in a first memory element and provides a product that is input into a first delay of one period, wherein said first delay provides a first basic unit output signal;

a second basic unit that receives and sums said past value input signal x[N−2] with said past value input signal x[N−4] and multiplies the resultant sum with a second coefficient value $C_{N-1}$ that is stored in a second memory element to provide a product that is summed with said first basic unit output signal and this resultant sum is input to a second delay of one period, wherein said second delay provides a second basic unit output signal;

a third basic unit that receives and multiplies said past value input signal x[N−4] with a third coefficient value $C_{N-2}$ that is stored in a third memory element to provide a product that is summed with said second basic unit output signal and the resultant sum is output as said programmable digital filter output signal;

a control processor that adaptively provides said first, second and third coefficient values; and a sign inverter, responsive to a first control signal from said control processor, for selectively inverting the sign of said programmable digital filter output signal that is fed back to said first basic unit and said second basic unit.

12. The programmable digital filter of claim 11, wherein said first and second memory elements are located in a common memory device.

13. The programmable digital filter of claim 11, wherein said programmable digital filter is located on a integrated circuit.

* * * * *

UNITED STATES PATENT AND TRADEMARK OFFICE
CERTIFICATE OF CORRECTION

PATENT NO. : 6,938,063 B2
DATED : August 30, 2005
INVENTOR(S) : Miodrag Temerinac It is certified that error appears in the above-identified patent and that said Letters Patent is hereby corrected as shown below:

Column 6,
Line 10, before "dashed" delete "at".
Line 42, delete "$C_{N=1}$" and insert -- $C_{N-1}$ --.

Signed and Sealed this

Twenty-seventh Day of December, 2005

JON W. DUDAS
*Director of the United States Patent and Trademark Office*